(12) United States Patent
Lee et al.

(10) Patent No.: US 8,026,582 B2
(45) Date of Patent: Sep. 27, 2011

(54) INTEGRATED CIRCUIT PACKAGE SYSTEM WITH INTERNAL STACKING MODULE ADHESIVE

(75) Inventors: Myung Kil Lee, Seoul (KR); Jae Chang Kim, Changwon-si (KR); Byung Ok Kim, legal representative, Changwon-si (KR); Koo Hong Lee, Seoul (KR)

(73) Assignee: Stats Chippac Ltd., Singapore (SG)

( * ) Notice: Subject to any disclaimer, the term of this patent is extended or adjusted under 35 U.S.C. 154(b) by 743 days.

(21) Appl. No.: 12/025,745

(22) Filed: Feb. 4, 2008

(65) Prior Publication Data

US 2009/0194867 A1    Aug. 6, 2009

(51) Int. Cl.
*H01L 23/053* (2006.01)
*H01L 23/02* (2006.01)
*H01L 23/52* (2006.01)

(52) U.S. Cl. ......... 257/686; 257/E23.142; 257/E23.011; 257/E23.085; 257/E25.013; 257/E25.006; 257/685; 257/777; 257/723; 257/701; 257/784; 257/786

(58) Field of Classification Search .................. 257/686, 257/685, 777, 723, 701, E23.142, E23.011, 257/E23.085, E25.013, E25.006, 784, 786
See application file for complete search history.

(56) References Cited

U.S. PATENT DOCUMENTS

| | | | |
|---|---|---|---|
| 6,833,287 B1 | 12/2004 | Hur et al. | |
| 6,933,598 B2 | 8/2005 | Karnezos | |
| 7,166,924 B2 | 1/2007 | Lu et al. | |
| 7,253,511 B2 * | 8/2007 | Karnezos et al. | 257/686 |
| 7,279,785 B2 * | 10/2007 | Ha et al. | 257/686 |
| 2007/0069391 A1 | 3/2007 | Gritti | |
| 2007/0158858 A1 * | 7/2007 | Hwang et al. | 257/784 |
| 2008/0315374 A1 * | 12/2008 | Kim et al. | 257/659 |
| 2009/0057861 A1 * | 3/2009 | Park et al. | 257/685 |
| 2009/0108428 A1 * | 4/2009 | Carson et al. | 257/686 |
| 2009/0115043 A1 * | 5/2009 | Chow et al. | 257/686 |
| 2009/0140407 A1 * | 6/2009 | Chow et al. | 257/686 |
| 2009/0152701 A1 * | 6/2009 | Kuan et al. | 257/686 |
| 2009/0224390 A1 * | 9/2009 | Yang et al. | 257/686 |
| 2010/0136744 A1 * | 6/2010 | Karnezos et al. | 438/107 |

* cited by examiner

*Primary Examiner* — A Williams
(74) *Attorney, Agent, or Firm* — Mikio Ishimaru

(57) ABSTRACT

An integrated circuit package system comprising: providing a substrate; forming a base assembled package over the substrate; forming a top package over the base assemble package; and applying a top package stacking material for stand-off or insulation to the base assembled package and the top package.

20 Claims, 3 Drawing Sheets

INTEGRATED CIRCUIT PACKAGE SYSTEM WITH INTERNAL STACKING MODULE ADHESIVE

TECHNICAL FIELD

The present invention relates generally to integrated circuit packages and more particularly to a system for integrated circuit packages with internal stacking modules.

BACKGROUND ART

Integrated circuits have become ubiquitous in many portable electronic products, such as cell phones, portable computers, voice recorders, etc. as well as in many larger electronic systems, such as cars, planes, industrial control systems, etc. Across all applications, there continues to be demand for reducing the size and increasing performance of the devices.

Virtually all electronic products benefit from increasing functions and performance in integrated circuit chips while being designed into ever-smaller physical space. These demands are often very visible with the many consumer electronic products including but not limited to personal portable devices, such as cellular phones, digital cameras, and music players.

Thus, there is a constant drive within the semiconductor industry to reduce dimensional footprints as well as increase quality, reliability, and performance. This drive is fueled by consumer demands for smaller, higher quality computers and electronic devices that operate more reliably.

These demands have resulted in continual improvement in the manufacture of semiconductor devices, e.g., transistors, as well as in the manufacture of integrated circuit packages incorporating such transistors. Additionally, reducing defects in the manufacture of the components including integrated circuit packages also lowers the overall cost of integrated circuit devices.

While stacking integrated circuits within integrated circuit packages has improved dimensional densities and footprints it has not been without problems. Integrated circuit failures have plagued integrated circuit package yields thereby increasing costs and reliability. Attempts to validate the individual integrated circuit devices address only a portion of the problems.

The ever-smaller integrated circuits and electrical connections can be easily damaged during manufacturing processing as well as handling. Protective packaging including encapsulation can protect the fragile circuits and connections once they have been applied. Unfortunately, the process of applying the integrated circuit package can also be a cause of damage.

Despite the advantages of recent developments in integrated circuit manufacturing, there is a continuing need for improving integrated circuit die and integrated circuit package attachment with stacked die and packages to provide improved dimensional sizes and footprints as well as structural integrity and manufacturing yield.

Thus, a need still remains for an integrated circuit package system to provide improved die attach, dimensions, and footprint. In view of the increasing demand for improved density of integrated circuits and particularly portable electronic products, it is increasingly critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides a substrate; forming a base assembled package over the substrate; forming a top package over the base assemble package; and applying a top package stacking material for stand-off or insulation to the base assembled package and the top package.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

Figure 1:
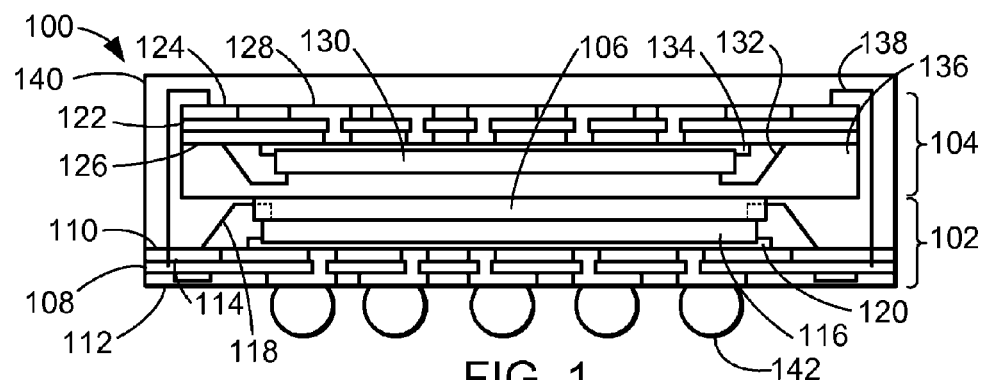
FIG. 1 is a cross-sectional view of an integrated circuit package system taken along line 1-1 of FIG. 2 in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGs.

Where multiple embodiments are disclosed and described, having some features in common, for clarity and ease of illustration, description, and comprehension thereof, similar and like features one to another will ordinarily be described with like reference numerals. The embodiments may be numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the invention, regardless of its orientation. The term "vertical" refers to a direction perpendicular to the horizontal as just defined. Terms, such as "on", "above", "below", "bottom", "top", "side" (as in "sidewall"), "higher", "lower", "upper", "over", and "under", are defined with respect to the horizontal plane.

The term "on" as used herein means and refers to direct contact among elements. The term "processing" as used herein includes deposition of material, patterning, exposure, development, etching, cleaning, and/or removal of the material or trimming as required in forming a described structure. The term "system" as used herein means and refers to the method and to the apparatus of the present invention in accordance with the context in which the term is used.

Figure 2:
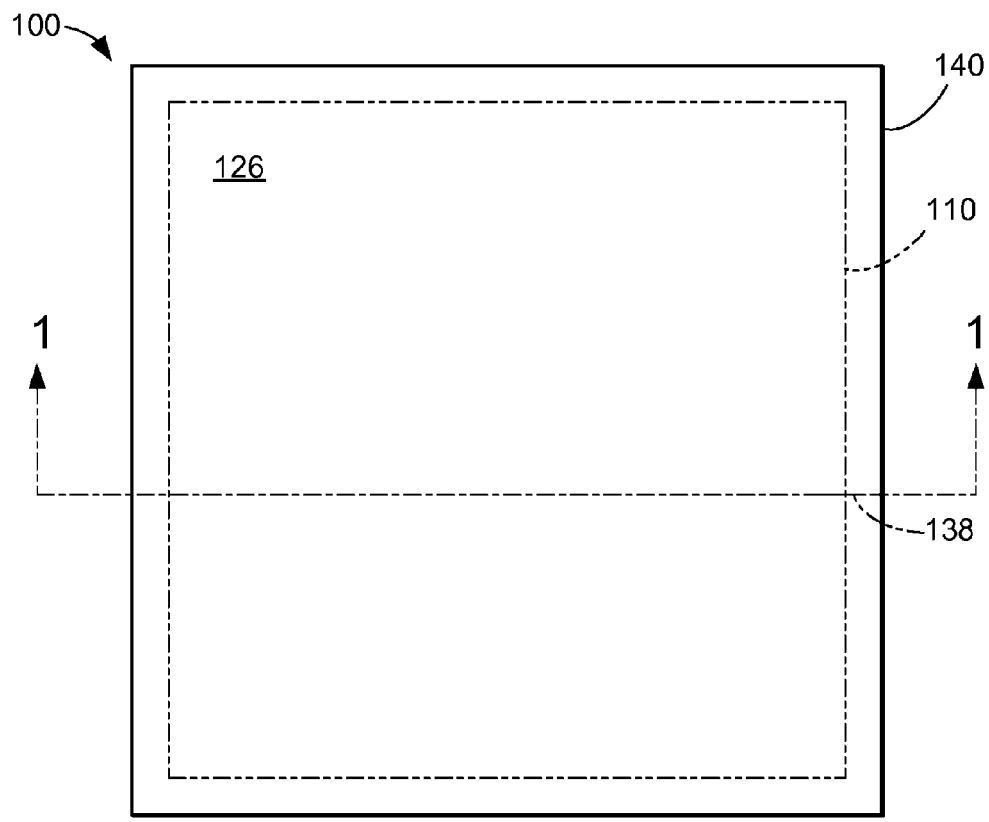
FIG. 2 is a top plan view of the integrated circuit package system.

Referring now to FIG. 1, therein is shown a cross-sectional view of an integrated circuit package system 100 taken along line 1-1 of FIG. 2 in a first embodiment of the present invention. The integrated circuit package system 100 preferably includes a base assembled package 102 (BAP) and a top package 104 such as an internal stacking module (ISM). The top package 104 can be stacked over the base assembled package 102 with a top package stacking material 106 such as organic material.

The top package stacking material 106 can include organic material such as film adhesive or film on wire (F.O.W or FOW) providing stand-off or insulation without damaging packaging components including small or delicate electrical connectors. Stand-off of the top package stacking material 106 can provide spacing of the top package 104 and the base assembled package 102 for eliminating damage. Insulation of the top package stacking material 106 can provide electrical or thermal separation of the top package 104 and the base assembled package 102 for improved performance.

The base assembled package 102 can include a base substrate 108 having a base substrate first surface 110, a base substrate second surface 112, and base substrate conductors 114. A base integrated circuit die 116 can be attached over the base substrate first surface 110 and electrically connected with base die connectors 118. The base die connectors 118 can connect die pads (not shown) of the base integrated circuit die 116 and the base substrate conductors 114. A base die attach layer 120 can be applied over the base substrate first surface 110 for attaching the base integrated circuit die 116.

The top package stacking material 106 can preferably be formed having a thickness providing spacing for attaching the base die connectors 118 over the base integrated circuit die 116. The top package stacking material 106 can cover a portion of or overlap the base integrated circuit die 116 on a side having the base die connectors 118. For illustrative purposes, the top package stacking material 106 is shown having a substantially uniform thickness although it is understood that the top package stacking material 106 may be formed differently. The top package stacking material 106 provides spacing and adhesion for the top package 104. The package stacking material 106 is further shown extending laterally beyond the base integrated circuit die 116 to partially embed the base die connectors 118 between the base integrated circuit die 116 and the base substrate 108.

The top package 104 can include a top substrate 122 having a top substrate first surface 124, a top substrate second surface 126, and top substrate conductors 128. A top integrated circuit die 130 can be attached over the top substrate first surface 124 and electrically connected with top die connectors 132. The top die connectors 132 can connect die pads (not shown) of the top integrated circuit die 130 and the top substrate conductors 128. A top die attach layer 134 can be applied over the top substrate first surface 124 for attaching the top integrated circuit die 130. A top encapsulant 136 can also be applied to the top package 104.

Top package connectors 138 can electrically connect the top package 104 and the base substrate 108. A package encapsulant 140 can be applied over the top package connectors 138, the top package 104 including the top encapsulant 136, and the base assembled package 102. The package encapsulant 140 can also cover or protect the base die connectors 118, the top package stacking material 106, the base integrated circuit die 116, the base die attach layer 120, or the base substrate first surface 110.

Package connectors 142 such as solder balls can be formed over the base substrate second surface 112. The package connectors 142 can provide electrical connectivity for the base integrated circuit die 116 or the top integrated circuit die 130 to a next level system such as another package, another integrated circuit, or a printed circuit board (PCB).

For illustrative purposes, one of the top package 104 over one of the base assembled package 102 are shown although it is understood that any number or configuration of the top package 104 or the base assembled package 102 may be used.

It has been discovered that the integrated circuit package system 100 with the top package stacking material 106 provides stand-off and insulation of the top package 104 substantially eliminating damage to the base assembled package 102 particularly the base die connectors 118 as well as substantially eliminating additional processing such as a second die attach and post cure.

Referring now to FIG. 2 therein is shown a top plan view of the integrated circuit package system 100. The integrated circuit package system 100 preferably includes the package encapsulant 140 for covering or protecting the top package connectors 138, the top package 104 of FIG. 1 including the top encapsulant 136 of FIG. 1, and the base assembled package 102 of FIG. 1. The package encapsulant 140 can also cover or protect the base die connectors 118 of FIG. 1, the top package stacking material 106 of FIG. 1, the base integrated circuit die 116 of FIG. 1, the base die attach layer 120 of FIG. 1, or the base substrate first surface 110.

The integrated circuit package system 100 can preferably improve functions in a smaller size as well as improving manufacturing processes or yield. Stacking the top package 104 over the base assembled package 102 forms a package in package (PiP) configuration providing a significantly smaller footprint. For illustrative purposes, the integrated circuit package system 100 is shown in a shape of a rectangle although it is understood that the integrated circuit package system 100 may be formed in any shape or size.

Figure 3:
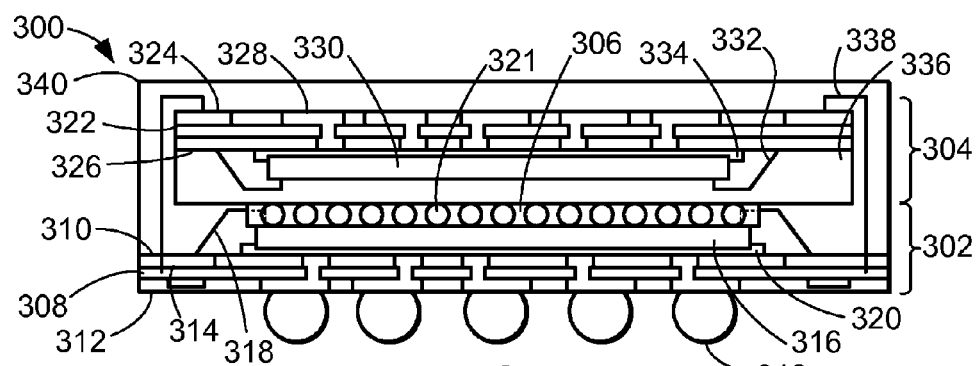
FIG. 3 is a cross-sectional view of an integrated circuit package system in a second embodiment of the present invention.

Referring now to FIG. 3, therein is shown a cross-sectional view of an integrated circuit package system 300 in a second embodiment of the present invention. The integrated circuit package system 300 preferably includes a base assembled package 302 and a top package 304 such as an internal stacking module. The top package 304 can be stacked over the base assembled package 302 with a top package stacking material 306 such as organic material.

The top package stacking material 306 can include organic material such as spacer epoxy providing stand-off or insulation without damaging packaging components including small or delicate electrical connectors. Stand-off of the top package stacking material 306 can provide spacing of the top package 304 and the base assembled package 302 for eliminating damage. Insulation of the top package stacking material 306 can provide electrical or thermal separation of the top package 304 and the base assembled package 302 for improved performance.

The base assembled package 302 can include a base substrate 308 having a base substrate first surface 310, a base substrate second surface 312, and base substrate conductors 314. A base integrated circuit die 316 can be attached over the base substrate first surface 310 and electrically connected with base die connectors 318. The base die connectors 318 can connect die pads (not shown) of the base integrated circuit die 316 and the base substrate conductors 314. A base die attach layer 320 can be applied over the base substrate first surface 310 for attaching the base integrated circuit die 316.

The top package stacking material 306 can preferably be formed having a thickness providing spacing for attaching the base die connectors 318 over the base integrated circuit die 316. The top package stacking material 306 can include spacer elements 321 to provide predetermined spacing for the base die connectors 318. For illustrative purposes, the spacer elements 321 are shown having a shape of a sphere although it is understood that the spacer elements 321 may be of any shape. The top package stacking material 306 provides spacing and adhesion for the top package 304. The top package stacking material 306 is further shown extending laterally beyond the base integrated circuit die 316 to partially embed the base die connectors 318 between the base integrated circuit die 316 and the base substrate 308.

The top package 304 can include a top substrate 322 having a top substrate first surface 324, a top substrate second surface 326, and top substrate conductors 328. A top integrated circuit die 330 can be attached over the top substrate first surface 324 and electrically connected with top die connectors 332. The top die connectors 332 can connect die pads (not shown) of the top integrated circuit die 330 and the top substrate conductors 328. A top die attach layer 334 can be applied over the top substrate first surface 324 for attaching the top integrated circuit die 330. A top encapsulant 336 can also be applied to the top package 304.

Top package connectors 338 can electrically connect the top package 304 and the base substrate 308. A package encapsulant 340 can be applied over the top package connectors 338, the top package 304 including the top encapsulant 336, and the base assembled package 302. The package encapsulant 340 can also cover or protect the base die connectors 318, the top package stacking material 306, the base integrated circuit die 316, the base die attach layer 320, or the base substrate first surface 310.

Package connectors 342 such as solder balls can be formed over the base substrate second surface 312. The package connectors 342 can provide electrical connectivity for the base integrated circuit die 316 or the top integrated circuit die 330 to a next level system such as another package, another integrated circuit, or a printed circuit board (PCB).

Figure 4:
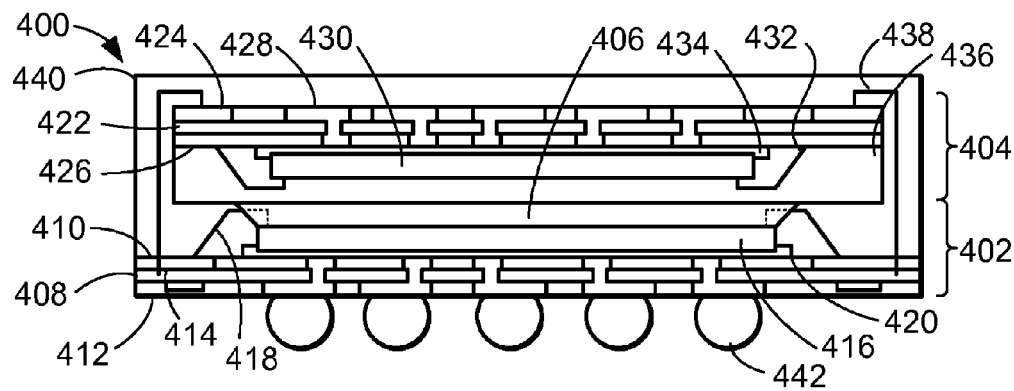
FIG. 4 is a cross-sectional view of an integrated circuit package system in a third embodiment of the present invention.

Referring now to FIG. 4, therein is shown a cross-sectional view of an integrated circuit package system 400 in a third embodiment of the present invention. The integrated circuit package system 400 preferably includes a base assembled package 402 and a top package 404 such as an internal stacking module. The top package 404 can be stacked over the base assembled package 402 with a top package stacking material 406 such as organic material.

The top package stacking material 406 can include organic material such as epoxy with heavy volume pouring providing stand-off or insulation without damaging packaging components including small or delicate electrical connectors. Stand-off of the top package stacking material 406 can provide spacing of the top package 404 and the base assembled package 402 for eliminating damage. Insulation of the top package stacking material 406 can provide electrical or thermal separation of the top package 404 and the base assembled package 402 for improved performance.

The base assembled package 402 can include a base substrate 408 having a base substrate first surface 410, a base substrate second surface 412, and base substrate conductors 414. A base integrated circuit die 416 can be attached over the base substrate first surface 410 and electrically connected with base die connectors 418. The base die connectors 418 can connect die pads (not shown) of the base integrated circuit die 416 and the base substrate conductors 414. A base die attach layer 420 can be applied over the base substrate first surface 410 for attaching the base integrated circuit die 416.

The top package stacking material 406 can preferably be formed having a thickness providing spacing for attaching the base die connectors 418 over the base integrated circuit die 416. The top package stacking material 406 can cover a portion of or overlap the base integrated circuit die 416 on a side having the base die connectors 418. For illustrative purposes, the top package stacking material 406 is shown wider at the top than at the bottom although it is understood that the top package stacking material 406 may be formed differently. The top package stacking material 406 provides spacing and adhesion for the top package 404. The top package stacking material 406 is further shown extending laterally beyond the base integrated circuit die 416 to partially embed the base die connectors 418 between the base integrated circuit die 416 and the base substrate 408.

The top package 404 can include a top substrate 422 having a top substrate first surface 424, a top substrate second surface 426, and top substrate conductors 428. A top integrated circuit die 430 can be attached over the top substrate first surface 424 and electrically connected with top die connectors 432. The top die connectors 432 can connect die pads (not shown) of the top integrated circuit die 430 and the top substrate conductors 428. A top die attach layer 434 can be applied over the top substrate first surface 424 for attaching the top integrated circuit die 430. A top encapsulant 436 can also be applied to the top package 404.

Top package connectors 438 can electrically connect the top package 404 and the base substrate 408. A package encapsulant 440 can be applied over the top package connectors 438, the top package 404 including the top encapsulant 436, and the base assembled package 402. The package encapsulant 440 can also cover or protect the base die connectors 418, the top package stacking material 406, the base integrated circuit die 416, the base die attach layer 420, or the base substrate first surface 410.

Package connectors 442 such as solder balls can be formed over the base substrate second surface 412. The package connectors 442 can provide electrical connectivity for the base integrated circuit die 416 or the top integrated circuit die 430 to a next level system such as another package, another integrated circuit, or a printed circuit board (PCB).

Figure 5:
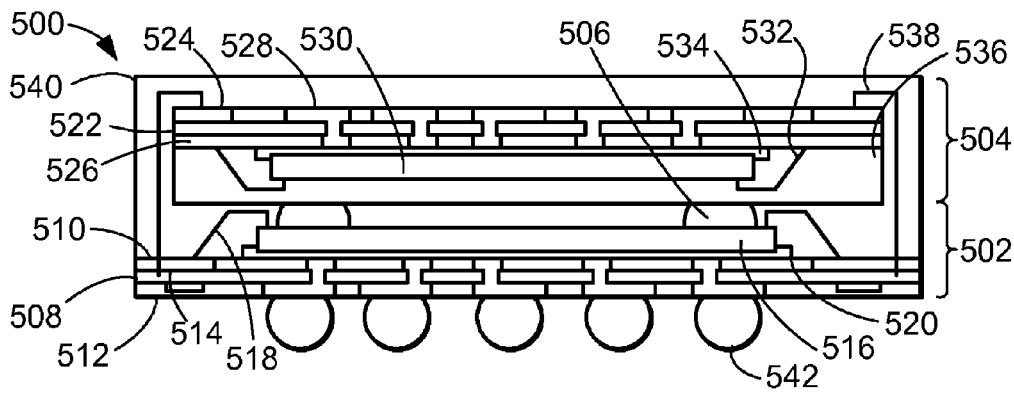
FIG. 5 is a cross-sectional view of an integrated circuit package system in a fourth embodiment of the present invention.

Referring now to FIG. 5, therein is shown a cross-sectional view of an integrated circuit package system 500 in a fourth embodiment of the present invention. The integrated circuit package system 500 preferably includes a base assembled package 502 and a top package 504 such as an internal stacking module. The top package 504 can be stacked over the base assembled package 502 with a top package stacking material 506 such as organic material.

The top package stacking material 506 can include organic material such as epoxy dotting with normal paste providing stand-off or insulation without damaging packaging components including small or delicate electrical connectors. Stand-off of the top package stacking material 506 can provide spacing of the top package 504 and the base assembled package 502 for eliminating damage. Insulation of the top package stacking material 506 can provide electrical or thermal separation of the top package 504 and the base assembled package 502 for improved performance.

The base assembled package 502 can include a base substrate 508 having a base substrate first surface 510, a base substrate second surface 512, and base substrate conductors 514. A base integrated circuit die 516 can be attached over the base substrate first surface 510 and electrically connected with base die connectors 518. The base die connectors 518 can connect die pads (not shown) of the base integrated circuit die 516 and the base substrate conductors 514. A base die attach layer 520 can be applied over the base substrate first surface 510 for attaching the base integrated circuit die 516.

The top package stacking material 506 can preferably be formed having a thickness providing spacing for attaching the base die connectors 518 over the base integrated circuit die 516. The top package stacking material 506 can be formed as dotted epoxy in a semi-spherical shape to provide predetermined spacing for the base die connectors 518. For illustrative purposes, the top package stacking material 506 is shown having two locations although it is understood that any number of the top package stacking material 506 may be formed. The top package stacking material 506 provides spacing and adhesion for the top package 504.

The top package 504 can include a top substrate 522 having a top substrate first surface 524, a top substrate second surface 526, and top substrate conductors 528. A top integrated circuit die 530 can be attached over the top substrate first surface 524 and electrically connected with top die connectors 532. The top die connectors 532 can connect die pads (not shown) of the top integrated circuit die 530 and the top substrate conductors 528. A top die attach layer 534 can be applied over the top substrate first surface 524 for attaching the top integrated circuit die 530. A top encapsulant 536 can also be applied to the top package 504.

Top package connectors 538 can electrically connect the top package 504 and the base substrate 508. A package encapsulant 540 can be applied over the top package connectors 538, the top package 504 including the top encapsulant 536, and the base assembled package 502. The package encapsulant 540 can also cover or protect the base die connectors 518, the top package stacking material 506, the base integrated circuit die 516, the base die attach layer 520, or the base substrate first surface 510.

Package connectors 542 such as solder balls can be formed over the base substrate second surface 512. The package connectors 542 can provide electrical connectivity for the base integrated circuit die 516 or the top integrated circuit die 530 to a next level system such as another package, another integrated circuit, or a printed circuit board (PCB).

Figure 6:
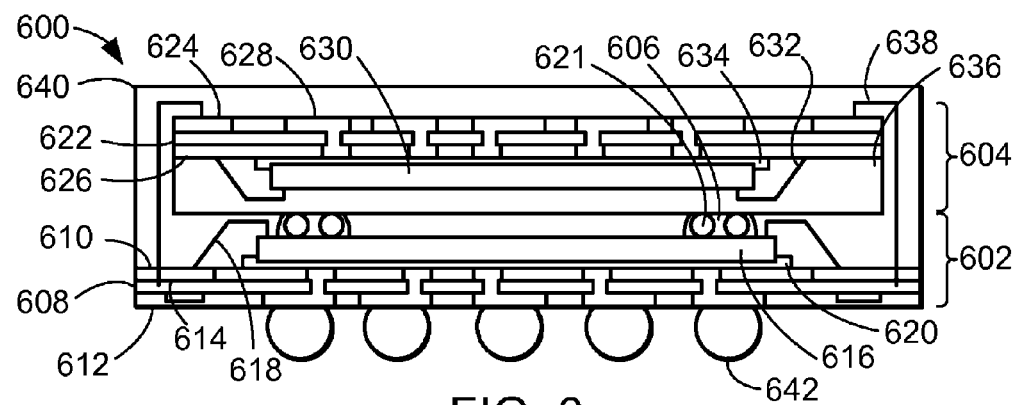
FIG. 6 is a cross-sectional view of an integrated circuit package system in a fifth embodiment of the present invention.

Referring now to FIG. 6, therein is shown a cross-sectional view of an integrated circuit package system 600 in a fifth embodiment of the present invention. The integrated circuit package system 600 preferably includes a base assembled package 602 and a top package 604 such as an internal stacking module. The top package 604 can be stacked over the base assembled package 602 with a top package stacking material 606 such as organic material.

The top package stacking material 606 can include organic material such as epoxy dotting with spacer epoxy providing stand-off or insulation without damaging packaging components including small or delicate electrical connectors. Stand-off of the top package stacking material 606 can provide spacing of the top package 604 and the base assembled package 602 for eliminating damage. Insulation of the top package stacking material 606 can provide electrical or thermal separation of the top package 604 and the base assembled package 602 for improved performance.

The base assembled package 602 can include a base substrate 608 having a base substrate first surface 610, a base substrate second surface 612, and base substrate conductors 614. A base integrated circuit die 616 can be attached over the base substrate first surface 610 and electrically connected with base die connectors 618. The base die connectors 618 can connect die pads (not shown) of the base integrated circuit die 616 and the base substrate conductors 614. A base die attach layer 620 can be applied over the base substrate first surface 610 for attaching the base integrated circuit die 616.

The top package stacking material 606 can preferably be formed having a thickness providing spacing for attaching the base die connectors 618 over the base integrated circuit die 616. The top package stacking material 606 can be formed as dotted epoxy in a semi-spherical shape with spacer elements 621 to provide predetermined spacing for the base die connectors 618. For illustrative purposes, the spacer elements 621 are shown having a shape of a sphere although it is understood that the spacer elements 621 may be of any shape. The top package stacking material 606 provides spacing and adhesion for the top package 604.

The top package 604 can include a top substrate 622 having a top substrate first surface 624, a top substrate second surface 626, and top substrate conductors 628. A top integrated circuit die 630 can be attached over the top substrate first surface 624 and electrically connected with top die connectors 632. The top die connectors 632 can connect die pads (not shown) of the top integrated circuit die 630 and the top substrate conductors 628. A top die attach layer 634 can be applied over the top substrate first surface 624 for attaching the top integrated circuit die 630. A top encapsulant 636 can also be applied to the top package 604.

Top package connectors 638 can electrically connect the top package 604 and the base substrate 608. A package encapsulant 640 can be applied over the top package connectors 638, the top package 604 including the top encapsulant 636, and the base assembled package 602. The package encapsulant 640 can also cover or protect the base die connectors 618, the top package stacking material 606, the base integrated circuit die 616, the base die attach layer 620, or the base substrate first surface 610.

Package connectors 642 such as solder balls can be formed over the base substrate second surface 612. The package connectors 642 can provide electrical connectivity for the base integrated circuit die 616 or the top integrated circuit die 630 to a next level system such as another package, another integrated circuit, or a printed circuit board (PCB).

Figure 7:
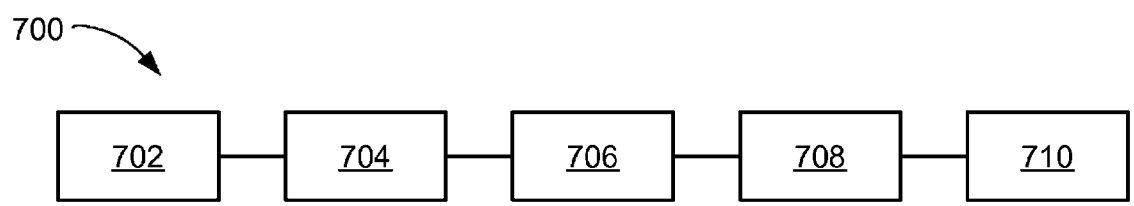
FIG. 7 is a flow chart of a die attach and molding process for the integrated circuit package system.

Referring now to FIG. 7, therein is shown a flow chart of a die attach and molding process for the integrated circuit package system 100. The integrated circuit package system 100 can include a die attach and post cure process in a block 702; a wire bond process in a block 704; an internal stacking module process in a block 706; a wire bond for internal stacking module process in a block 708; and a mold process in a block 710.

The top package stacking material 106 of FIG. 1 can provide room and spacing to secure the base die connectors 118 thereby eliminating the need for a second die attach process as well as a second post cure process. The integrated circuit package system 100 with the top package stacking material 106 can provide significant manufacturing cost reduction.

Figure 8:
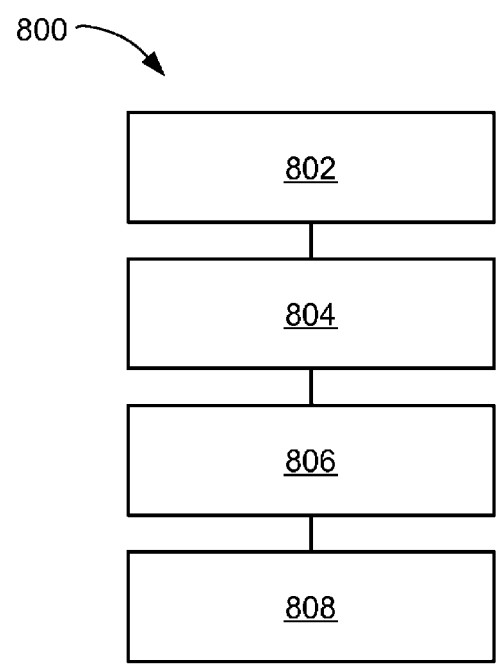
FIG. 8 is a flow chart of an integrated circuit package system for manufacturing the integrated circuit package system in an embodiment of the present invention.

Referring now to FIG. 8, therein is shown a flow chart of an integrated circuit package system 800 for manufacturing the integrated circuit package system 100 in an embodiment of the present invention. The system 800 includes providing a substrate in a block 802; forming a base assembled package over the substrate in a block 804; forming a top package over the base assemble package in a block 806; and applying a top package stacking material for stand-off or insulation to the base assembled package and the top package in a block 808.

In greater detail, a system to provide the method and apparatus of the integrated circuit package system 100, in an embodiment of the present invention, is performed as follows:

1. Providing a base substrate.
2. Attaching a base integrated circuit die over the base substrate.
3. Attaching base die connectors to the base integrated circuit die and the substrate.
4. Forming a top package having a top integrated circuit die over the base integrated circuit die.
5. Applying a top package stacking material for stand-off or insulation to the base integrated circuit die and the top package Thus, it has been discovered that the integrated circuit package system method and apparatus of the present invention furnish important and heretofore unknown and unavailable solutions, capabilities, and functional aspects. The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations, which fall within the scope of the included claims. All matters hithertofore set forth herein or shown in the accompanying drawings are to be interpreted in an illustrative and non-limiting sense.

What is claimed is:

1. A method of manufacture of an integrated circuit package system comprising:
    providing a substrate;
    forming a base assembled package over the substrate;
    forming a top package;
    applying a top package stacking material for stand-off or insulation to the top package; and
    stacking the top package over the base assembled package with the top package stacking material embedding connectors between the base assembled package and the substrate, and the top package stacking material extends laterally beyond the base assembled package.

2. The method as claimed in claim 1 wherein applying the top package stacking material includes applying an organic material.

3. The method as claimed in claim 1 wherein applying the top package stacking material includes applying a film adhesive or film on wire.

4. The method as claimed in claim 1 wherein forming the top package includes applying a top encapsulant.

5. The method as claimed in claim 1 wherein forming the base assembled package includes attaching a base integrated circuit die over the substrate.

6. A method of manufacture of an integrated circuit package system comprising:
    providing a base substrate;
    attaching a base integrated circuit die over the base substrate;
    attaching base die connectors to the base integrated circuit die and the base substrate;
    forming a top package having a top integrated circuit die;
    applying a top package stacking material for stand-off or insulation to the package; and
    stacking the top package over the base integrated circuit die with the base die connectors partially embedded within the top package stacking material and with the top package stacking material extending laterally beyond the base integrated circuit die.

7. The method as claimed in claim 6 wherein applying the top package stacking material includes applying a spacer epoxy having spacer elements.

8. The method as claimed in claim 6 wherein applying the top package stacking material includes applying an epoxy wider at the top than at the bottom.

9. The method as claimed in claim 6 wherein applying the top package stacking material includes applying a dotted epoxy.

10. The method as claimed in claim 6 wherein applying the top package stacking material includes applying a dotted epoxy having spacer elements.

11. An integrated circuit package system comprising:
    a substrate;
    a base assembled package over the substrate;
    a top package over the base assembled package; and
    a top package stacking material for stand-off or insulation applied to the base assembled package and the top package with the top package stacking material embedding connectors between the base assembled package and the substrate, and top package stacking material extends laterally beyond the base assembled package.

12. The system as claimed in claim 11 wherein the top package stacking material is an organic material.

13. The system as claimed in claim 11 wherein the top package stacking material is a film adhesive or film on wire.

14. The system as claimed in claim 11 wherein the top package includes a top encapsulant.

15. The system as claimed in claim 11 wherein the base assembled package includes a base integrated circuit die over the substrate.

16. The system as claimed in claim 11 wherein:
    the substrate is a base substrate;
    the base assembled package includes a base integrated circuit die over the base substrate;
    the top package includes a top integrated circuit die over the base integrated circuit die;
    the top package stacking material is the top package stacking material for stand-off or insulation attached to the base integrated circuit die and the top package; and
    the connectors are base die connectors partially embedded within the top package stacking material and attached to the base integrated circuit die and the base substrate.

17. The system as claimed in claim 16 wherein the top package stacking material is a spacer epoxy having spacer elements.

18. The system as claimed in claim 16 wherein the top package stacking material is an epoxy wider at the top than at the bottom.

19. The system as claimed in claim 16 wherein the top package stacking material is a dotted epoxy.

20. The system as claimed in claim 16 wherein the top package stacking material is a dotted epoxy having spacer elements.

* * * * *

UNITED STATES PATENT AND TRADEMARK OFFICE
CERTIFICATE OF CORRECTION

| | | |
|---|---|---|
| PATENT NO. | : 8,026,582 B2 | Page 1 of 1 |
| APPLICATION NO. | : 12/025745 | |
| DATED | : September 27, 2011 | |
| INVENTOR(S) | : Lee et al. | |

It is certified that error appears in the above-identified patent and that said Letters Patent is hereby corrected as shown below:

Column 10:

claim 6, line 5, delete "insulation to the package; and" and insert therefor --insulation to the top package; and--

Signed and Sealed this
Twenty-ninth Day of May, 2012

David J. Kappos
*Director of the United States Patent and Trademark Office*